(12) United States Patent
Sloane et al.

(10) Patent No.: US 7,791,511 B1
(45) Date of Patent: Sep. 7, 2010

(54) CONSTANT WEIGHT CODING OF SIGNALS BASED ON CONJUGATE DISSECTIONS

(76) Inventors: Neil James Alexander Sloane, 11 S. Adelaide Ave., Highland Park, NJ (US) 08904; Vinay Anant Vaishampayan, 48 Tall Oaks Dr., Summit, NJ (US) 07901

( * ) Notice: Subject to any disclaimer, the term of this patent is extended or adjusted under 35 U.S.C. 154(b) by 551 days.

(21) Appl. No.: 11/881,653

(22) Filed: Jul. 27, 2007

(51) Int. Cl.
*H03M 7/00* (2006.01)

(52) U.S. Cl. .......................... 341/81; 341/50
(58) Field of Classification Search ............ 341/81, 341/50; 714/752, 755, 758, 771
See application file for complete search history.

(56) References Cited

U.S. PATENT DOCUMENTS

| | | | | |
|---|---|---|---|---|
| 6,029,264 | A * | 2/2000 | Kobayashi et al. | 714/755 |
| 7,526,710 | B2 * | 4/2009 | Sawaguchi | 714/755 |
| 7,584,400 | B2 * | 9/2009 | Gray et al. | 714/755 |

* cited by examiner

*Primary Examiner*—Brian Young

(57) ABSTRACT

A method for encoding and decoding codes of constant weight that is based on conjugate dissections, which progressively modifies element values of an input vector to satisfy the constraint that each encoded symbol is to comprise integer component elements even when the encoded symbol is generated through processing that involved permuting.

6 Claims, 2 Drawing Sheets

US 7,791,511 B1

CONSTANT WEIGHT CODING OF SIGNALS BASED ON CONJUGATE DISSECTIONS

RELATED APPLICATIONS

This application is related to U.S. patent application filed Jun. 7, 2006, which bears the Ser. No. 11/448,550 ('550).

BACKGROUND

This invention relates to coding of data and is applicable to communication of data, networking, fault-tolerant computing, magnetic as well as optical recording of data.

A binary constant weight block code is a code where each member of the code, i.e., each n-bit codeword has a constant number, w, of 1's. In an effort to devise an effective and fast method for encoding and decoding constant weight codes, the inventors herein disclosed in the aforementioned '550 patent application a method of wide applicability. The advance disclosed in the '550 patent application employs a piecewise linear algorithm, P, that maps w-dimensional information vectors into code vectors, followed by the construction of binary code vectors of weight w from the code vectors. To reverse the operation, constant weight codewords are converted to w-dimensional code vectors, and a reverse piecewise linear algorithm P' is used to map the code vectors into information vectors, from which data is recovered.

More specifically, as illustrated in FIG. 1, input data is mapped in element 2 into the w-dimensional information vectors that are subsumed by a w-dimensional parallelopiped, with possibly different size of the parallelopiped along each of the w coordinates and in which the symbols along each of the coordinate axes are spaced equally apart. The w-dimensional parallelopiped ("brick"), as illustrated in FIG. 1 by the 2-dimensional "brick" composed of elements 12 and 13' in the plot pointing to the signal line between elements 2 and 4. The P mapping, executed in element 4, maps the w-dimensional symbols to code vectors in a w-dimensional orthoscheme, illustrated by elements 12 and 13 in the plot pointing to the signal line between elements 4 and 6. The key attribute of this mapping is that points subsumed by the orthoscheme are characterized by the fact that $x_1 < x_2 < x_3 < \ldots < x_w \leq n$, where $x_i$ is the $i^{th}$ coordinate of the orthoscheme and n is the block length of the code. The code vectors developed by element 4 are applied to element 6, where the constant weight codes are developed by a mapping $\Gamma$. The mapping $\Gamma$ is quite simple because the values of the coordinates can be viewed as representing the positions of the 1's in the constant weight code.

It is to be noted that the algorithm P(is obtained through a process of dissecting two polytopes of different shapes into an equal number of pieces, in such a way that corresponding pieces are congruent. In other words, the algorithm is a description of the transformations required to dissect the first polytope and to reassemble the pieces so as to form the second polytope. Because of the specific dissections used, this same algorithm also maps vectors with integer coordinates inside the first polytope to vectors with integer coordinates in the second polytope. Furthermore, this algorithm is piecewise affine.

One interesting application for constant weight codes involves superimposing a slow channel over a fast channel (e.g., a control channel over a data channel). Information on the fast channel can be sent using codewords from different constant weight codebooks, and the codebook that is employed is chosen by the information of the slow channel. For example, a 256 bit long codeword of constant weight 127 (codebook A) can be used to send data from the fast channel when the slow channel wishes to communicate a "0," and a 256 bit long codeword of constant weight 129 (codebook B) can be used to send data from the fast channel when the slow channel wishes to communicate a "1." It may be noted in passing that a 256 bit long code word of constant weight 127 can communicate a number of symbols equal to the number of ways that 127 bits can be chosen within 256 bits, and thus can be used for communicating a maximum of 251 bits $$\left(251 < \log_2 \binom{256}{127} < 252\right).$$

The method disclosed in the '550 application is very simple and effective, but it is characterized by an encoding/decoding processing time on the order of $w^2$, which in applications where w is large, can become an issue.

SUMMARY

An advance. in the art is realized with a coding method that first pre-codes an incoming signal into a vector within a first polytope having preselected coordinate constraints, performing a first transformation of the pre-coded vector, said first transformation being a nonlinear approximation of a first linear transformation, into another vector within the same polytope, to thereby form a transformed vector having the same coordinate constraints and the additional constraint that the coordinates of the transformed vector are in descending order, mapping the transformed vector to another vector using a second linear transformation to form an intermediate vector, transforming the intermediate vector into a code vector using a transformation that is the inverse of the first linear transformation, and mapping the code vector a binary codeword having a constant weight.

DETAILED DESCRIPTION

The present disclosure, like the disclosure in the '550 application, constructs a bijection in order to define an encoder, but its processing time is potentially on the order of w·log w (w being the weight of the code) which, of course, is smaller than the $w^2$ in the '550 application.

Figure 1:
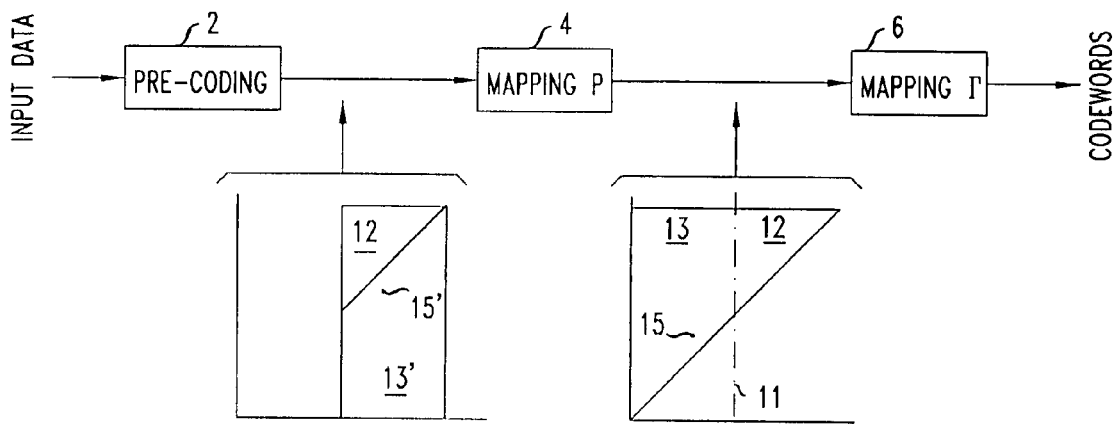
FIG. 1 shows a prior art encoder arrangement that is based on conjugate dissection.
Figure 2:
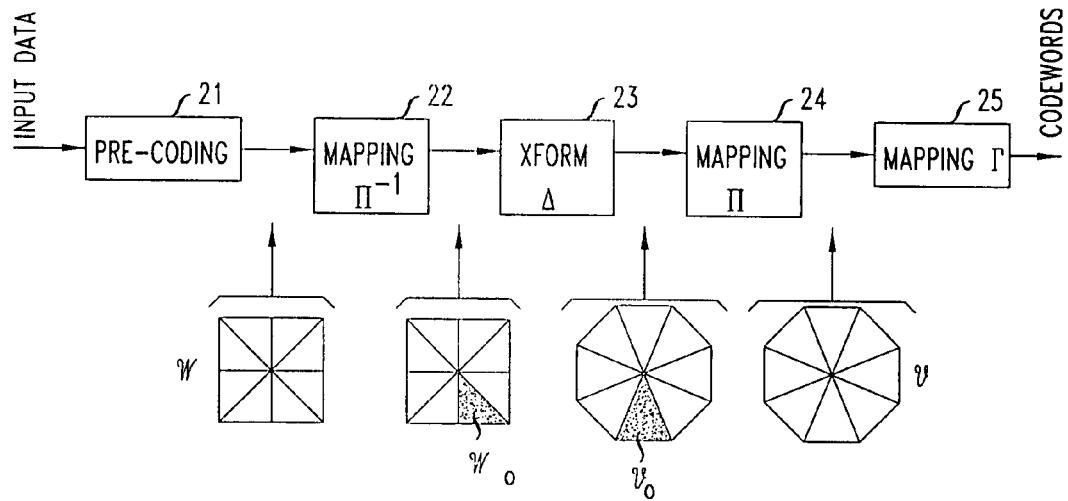
FIG. 2 shows a conjugate-dissection-based encoder in accord with the principles disclosed herein.

As depicted in FIG. 2, in accord with the principles disclosed herein input data is pre-coded by element 21 into information vectors, where each symbol x, is composed of elements $(x_1, x_2, \ldots x_w)$. The symbols are contained within a w-dimensional polytope W, which geometrically is a w-dimensional cube. Additionally, the elements of x are constrained so that the difference between the value of $x_i$ and $x_{i+1}$ is a multiple of w−i+1.

For exposition purposes a constant weight code of length 22 and weight 5 is employed and, to that end, the input data that is applied to element 21 is pre-encoded to form 5-element code vectors, where each element is limited in value to the length of the code minus the weight of the code, i.e., to 17, and also satisfies the above-mentioned constraint.

There are numerous ways by which element 21 may carry out the necessary pre-coding. One way, for example, is to partition the input stream into 12 bit blocks and partition each block into bit vectors $b_1$, $b_2$, $b_3$, $b_4$ and $b_5$, consisting of 4, 1, 2, 2, and 3 bits, respectively. Let $i(b_1)$ be the integer value of bit vectors $b_1$ and $i(b_2)$ be the integer value of vector $b_2$, and so on. Bit vector $b_1$ is mapped to $x_1=i(b_1)$, bit vector $b_2$ is mapped according to equation $x_2=5i(b_2)+(x_1)_{mod\ 5}$, bit vector $b_3$ is mapped according to equation $x_3=4i(b_3)+(x_2)_{mod\ 4}$, bit vector $b_4$ is mapped according to equation $x_4=3i(b_4)+(x_3)$, and bit vector $b_5$ is mapped according to equation $x_5=2i(b_5)+(x_4)_{mod\ 2}$.

It may be noted that the approach of partitioning the 12-bit block into five non-overlapping vectors is easy to implement, but it does lose some capacity.

As depicted in FIG. 2, following the pre-coding by element 21 the symbols are mapped in element 22 to symbols with sorted, descending, coordinate values, which means that the input data is mapped to a specific w-dimensional simplex. This sorting is performed in a conventional manner. It may he noted that ascending order can also be employed.

A note about notations. Given a representation of a matrix, $\Pi$, and a set X that lies in the domain of this mapping, the following exposition uses $\Pi X$ to denote the set of all vectors obtained by applying $\Pi$ to every element of X, i.e., if $Y=\Pi X$ then we mean $Y=(\Pi x, x \in X)$.

The sorting operation can be represented by a permutation matrix $\Pi^{-1}$ that pre-multiples the code vector x. The sorted vector $x_\downarrow$ results from the product $\Pi^{-1} x$. Since the permutation matrix is dependent on x, it may be expressed by $\Pi^{-1}(x)$ when necessary. For the above example, the sorting yields the vector (17, 15, 11, 10, 5) from the vector (10, 15, 11, 5, 17), which corresponds to the permutation matrix $$\Pi^{-1}(x) = \begin{bmatrix} 0 & 0 & 0 & 0 & 1 \\ 0 & 1 & 0 & 0 & 0 \\ 0 & 0 & 1 & 0 & 0 \\ 1 & 0 & 0 & 0 & 0 \\ 0 & 0 & 0 & 1 & 0 \end{bmatrix}. \quad (1)$$

For illustrative purposes, the w-dimensional cube of W is depicted by the square in the drawing that points to the signal line between elements 21 and 22 in FIG. 2, and the simplex into which all encoded symbols are mapped by element 22 is depicted by the hashed triangle in the drawing that points to the signal line between elements 22 and 23. Of course, all vectors that happen to have the same order as (17, 15, 11, 10, 5) are associated with the same permutation matrix. A different permutation matrix is, however, associated with vectors where the elements are ordered differently.

In other words, index the w! different w×w permutation matrices by i, i=0,1, ..., w!−1, with the identity permutation having index equal to zero, We may then tag information vector x with a label i, if i is the smallest index for which the permutation matrix $(\Pi_i)^{-1}$ sorts the components of x in descending order. If we denote the set of all such vectors $W_i$, it can be shown that $\{W_i=\mathbf{0,1}, \ldots w!-1\}$ is a dissection of W.

In connection with FIG. 2, the output of element 21 is found within some polytope $W_i$, and element 22 maps that output to polytope $W_0$.

In the exposition that follows, a simplex X is represented by a w×w matrix X each column of which is an extreme non-zero point of the simplex. It is assumed that one extreme point is at the origin and is not represented (though understood to be included). Thus, in matrix notation one can state that $$W_0 = \Pi_i^1 W_i = \mathbf{0,1,2}, \ldots w!-1. \quad (2)$$

It may be noted that $\Pi^{-1}(x)$ and $\Pi_i^{-1}$ are the same matrix if x, lies in $W_i$.

The symbols mapped by element 22 are applied to element 23, where they are transformed by transformation $\Delta$, as described in more detail below, to form transformed symbols that are contained in a different polytope, depicted by hatched triangle $V_0$. The transformed symbols at the output of element 23 are applied to element 24, where the mapping $\Pi_i$ is performed—precisely the inverse of the mapping performed in element 23—to map the transformed symbols from polytope $V_0$ into polytope $V_i$. In matrix notation, this is expressed by, $$V_i = \Pi_i V_0\ i = \mathbf{0,1,2}, \ldots w!-1. \quad (3)$$

It may be noted that the inverse of $\Pi$ is its transpose; i.e., $\Pi^{-1} = \Pi^T$.

Lastly, the transformed and mapped symbol developed by element 24, which lies generally in polytope V and in particular in some polytopal subset $V_i$, is applied to element 25 that develops the constant weight codewords through mapping $\Gamma$. The output of element 24 is a set of numbers each of which specifies the number of 0's between adjacent 1's in the final constructed code, and mapping $\Gamma$ within element 25 computes the absolute position of the placement of !'s in the final constructed code. For example, relative to an input to element 25 of (5,1,1,10,0), the number 10 specifies 10 0's between the $3^{rd}$ and the $4^{th}$ 1 counting, for example, from the left. Thus, for this example the mapping of element 35 produces the codeword 00000101010000000011.

The vectors that are sorted in descending order as described above are contained in the simplex that is represented by the matrix $$W_0 = U = \begin{bmatrix} 1 & 1 & 1 & \ldots & 1 \\ 0 & 1 & 1 & \ldots & 1 \\ 0 & 0 & 1 & \ldots & 1 \\ \vdots & \vdots & \vdots & \ddots & \vdots \\ 0 & 0 & 0 & \ldots & 1 \end{bmatrix}. \quad (4)$$

That is, a vector with elements $(\alpha_1, \alpha_2, \ldots, \alpha_w)$, where $\alpha_i$ is positive, after pre-multiplication by $W_0$ in equation (4), results in a vector whose elements are in descending order.

In accord with this disclosure, the polytopal subset $V_0$ is represented by the matrix $$V_0 = \begin{bmatrix} 1/w & 0 & 0 & \ldots & 0 \\ 1/w & 1/(w-1) & 0 & \ldots & 0 \\ 1/w & 1/(w-1) & 1/(w-2) & \ldots & 0 \\ \vdots & \vdots & \vdots & \ddots & \vdots \\ 1/w & 1/(w-1) & 1/(w-2) & \ldots & 1 \end{bmatrix} \quad (5)$$

and the observation can be made that the columns of the matrix of equation (7), together with the w-dimensional zero-vector defines a simplex, where any point belonging to the simplex has coordinates arranged in ascending order.

Based on the above, and in accord with the depiction in FIG. 2, the mapping $\Delta$ is defined by $$\Delta = V_0 W_0^{-1}, \qquad (6)$$

and carrying out the calculations for equation (6) based on equations (4) and (5) yields $$\Delta = \begin{bmatrix} 1/w & -1/w & 0 & 0 & \cdots & 0 \\ 1/w & 1/w(w-1) & -1/(w-1) & 0 & \cdots & 0 \\ 1/w & 1/w(w-1) & 1/(w-1)(w-2) & -1/(w-2) & \cdots & 0 \\ 1/w & 1/w(w-1) & 1/(w-1)(w-2) & 1/(w-2)(w-3) & \cdots & 0 \\ \vdots & \vdots & \vdots & \vdots & \ddots & -1/2 \\ 1/w & 1/w(w-1) & 1/(w-1)(w-2) & 1/(w-2)(w-3) & \cdots & 1/2 \end{bmatrix}. \qquad (7)$$

Based on the above, the encoding algorithm for real numbers is as follows:
1. Encode a group of input bits into a vector x.
2. Sort vector x and compute the corresponding permutation matrix $\Pi_i^{-1}$ such that $\Pi_i^{-1}$ x results in sorted vector $x_\downarrow$ (i.e., sorted in descending order); and compute the inverse permutation matrix $\Pi_i$.
3. Compute the vector $z_\uparrow = \Delta x_\downarrow$.
4. Compute $z = \Pi_i z_\uparrow$.
5. Encode $y = \Gamma z$.

The decoding algorithm is as follows:
1. Read in code vector y from channel.
2. Compute $z = \Gamma^{-1} y$.
3. Compute $z_\uparrow = \Pi \Delta^{-1} z_\uparrow$, which is the desired information word.

The above-disclosed algorithm is for real numbers, in the sense that although the elements of input vector x are limited to integer values, the elements of output vector z are not limited to integer values because transformation matrix $\Delta$ contains non-integer (rational) numbers. In the practical real-life coding applications, however, it is generally necessary for the coded results to have integer values.

It can be shown that the product $\Delta x_\downarrow$ results in a vector of integer element values if and only if $x_\downarrow$ is a vector of integers that satisfies the modular constraints $$(x_i - x_{i+1}) = 0 \bmod (w-i+1), i=1,2,\ldots,w-1, \qquad (8)$$

where $x_i$ is the $i^{th}$ component of vector $x_\downarrow$. It can be shown that this constraint restricts the values of x to a lattice. For example, for w=2, if $x_i = a$, $x_{i+1}$ can only be a+2k, where k is any (positive or negative) integer. For sake of simplicity, the modular constraint in equation (8) is referred to herein simply as the Modular Constraint, and vectors that satisfy the Modular Constraint are labeled with a prime, e.g., x' is a vector whose components satisfy the Modular Constraint.

Keeping in mind that, ultimately, what is desired is a sorted vector $x_\downarrow$ with components that satisfy the Modular Constraint, i.e., $x'_\downarrow$, it is necessary to have an unsorted vector that also satisfies the Modular constraint; but pre-coding of the input signal in a manner that does not initially impose this constraint is not likely to yield a sorted vector with components that satisfy the Modular Constraint. What is needed, then, is a pre-coded (by element 21) vector that satisfies the Modular Constraint and from that vector a modified vector is developed which approximates the coded vector in a manner that can later be reversed (to undo the approximation) and which, when sorted, results in a vector of elements that satisfy the modular constraint. This is accomplished by focusing on a vector that represents the differences between adjacent elements of the pre-coded vector and on a vector that represents the differences between adjacent elements of the sorted vector, progressively constructing the differences of the modified vector such that the Modular Constraint is satisfied after sorting, and developing the final desired sorted vector and the modified vector from the constructed differences. To that end, a w×w matrix D is constructed of the form $$D = \begin{bmatrix} 1 & -1 & 0 & \cdots & 0 \\ 0 & 1 & -1 & \ddots & \vdots \\ \vdots & \ddots & \ddots & -1 & 0 \\ 0 & \cdots & 0 & 1 & -1 \\ 1 & 1 & \cdots & 1 & 1 \end{bmatrix}, \qquad (9)$$

allowing the creation of difference vectors $$v = Dx, \qquad (10)$$

and $$\delta = D x_\downarrow. \qquad (11)$$

Given that $x_\downarrow$ is developed by $x_\downarrow = \Pi^{-1}(x) x$ where $\Pi^{-1}(x)$ is the permutation matrix that sorts vector x in descending order, it follows that $$\delta = D \Pi^{-1}(x) D^{-1} v, \qquad (12)$$

or $$\delta = T(x) v, \qquad (13)$$

where $$T(x) = D \Pi^{-1}(x) D^{-1}. \qquad (14)$$

As indicated above, it is not expected that the difference vector $\delta$ satisfies the Modular Constraint, so in accord with the principles disclosed herein a different differences vector $\tilde{\delta}$ is constructed, concurrently with an modified vector $\tilde{x}'$ that also satisfies the Modular Constraint, so that $D^{-1}\tilde{\delta}$ is a sorted vector that satisfies the Modular Constraint.

To achieve the above, select the order (w−1) leading principal sub-matrix of T(x'), $T_{w-1}^{\#}$, and perform an LU decomposition of this matrix, multiplied by whatever (w−1)×(w−1) permutation matrix P is necessary in order to be able to do the decomposition. In other words, develop the elements of $L^{-1}$ and of U in $PT_{w-1}^{\#} = L^{-1}U$. The structure of $T_{w-1}^{\#}$ develops an $L^{-1}$ matrix that has +1 entries on the main diagonal, and a U matrix that has ±1 entries on the main diagonal. It may be noted, however, that the LU decomposition is not a unique decomposition.

Based on this factorization, elements of the modified vector $\tilde{\delta}$ are constructed as follows:

$$\tilde{\delta}_i = (w-i+1) \left\lfloor \frac{\left(\sum_{j=1}^{w-1} U_{i,j} v_j - \sum_{j=1}^{i-1} L_{i,j} \tilde{\delta}_j\right)}{w-i+1} \right\rfloor, \quad i=1,2,\ldots,w-1, \quad (15)$$

where $U_{i,j}$ and $L_{i,j}$ are elements of U and L, respectively, and $\lfloor \bullet \rfloor$ is the integer portion of $\bullet$. Note that when computing $\tilde{\delta}_1$ the second summation in equation (15) is a null.

The transformed vector $\tilde{x}'_\downarrow = (\tilde{x}'_1, \tilde{x}'_2, \ldots, \tilde{x}'_w)$ is computed by $$\tilde{x}_1 = \max_{i, 1 \le i \le w} x_i \quad (16)$$

$$\tilde{x}_{i+1} = \tilde{x}_i - \tilde{\delta}_i, \quad i=1,2,\ldots,w-1$$

and, of course, the modified vector corresponds to $\tilde{x}' = \Pi(x) \tilde{x}'_\downarrow$.

In order to reverse the steps, we start with $\tilde{x}'_\downarrow$ and assuming that $\Pi(x)$ is known, we compute the matrix T using equation (14) and then obtain lower and upper triangular matrices, as before. The first (w−1) components of v are then recovered from $$v_i = U(i,i)(w-i+1) \left\lceil \frac{\sum_{j=1}^{i} L_{i,j} \tilde{\delta}_j - \sum_{j=i+1}^{w-1} U_{i,j} v_j}{(w-i+1)} \right\rceil \quad i=(w-1), \quad (17)$$

$$(w-2), \ldots, 1$$

where $L_i^{-1}$ is the $i^{th}$ row of L, $U_{i,j}$ is the (i,j) entry of U, and $\lceil \bullet \rceil$ is $\bullet$ rounded up to the next integer. From here, the vector x can be easily recovered since the position of the largest component of x is known and its value is the same as the largest value of $\tilde{x}'_\downarrow$. A similar technique involving successive rounding is used for constructing perfect inversion transforms in the signal processing literature, such as Bruckers et al, "New networks for perfect inversion and perfect reconstruction," *IEEE J. Sel. Areas Comm.*, vol. 10, pp. 130-137, January, 1993.

Figure 3:
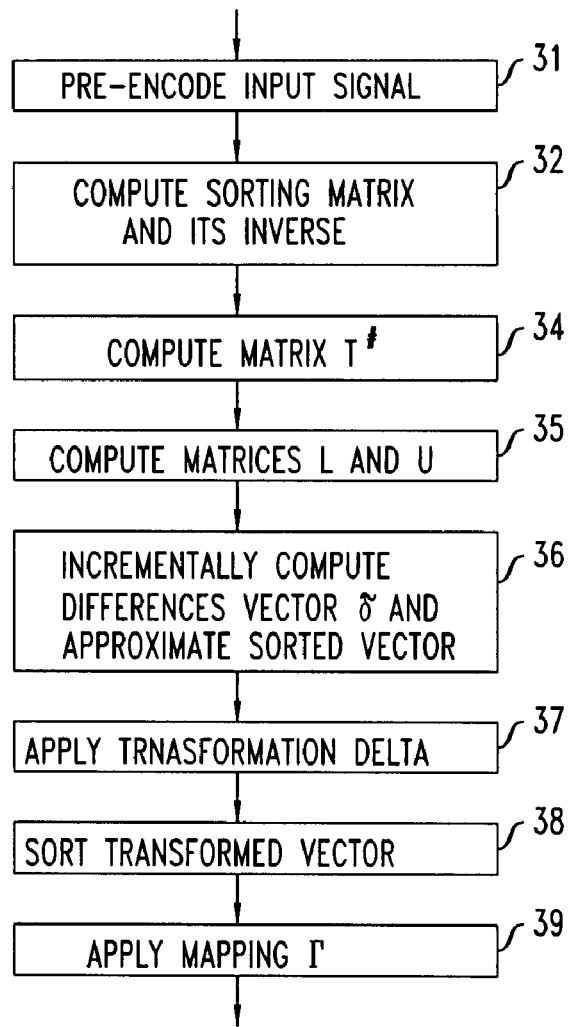
FIG. 3 depicts the method used in the FIG. 2 arrangement.

Based on the above, the encoding process that was summarized above in a 5-step method is augmented as depicted in FIG. 3. In step 31 a block of the input signal bits is pre-coded in element 21 into vector x. In block 32 the input vector is sorted and the permutation matrix $\Pi_i^{-1}$ is identified such that $\Pi_i^{-1} x$ results in sorted vector $x_\downarrow$, as well as its inverse, $\Pi_i$. In step 34 the matrix $T^\#$ is computed, in step 35 the diagonal matrices $L^{-1}$, L and U are computed, in step 36 the difference vector $\tilde{\delta}$ components and the resultant sorted approximation vector (descending order) $\tilde{x}'_\downarrow$ is computed, and in step 37 computes the vector z that corresponds to $\Delta \tilde{x}'_\downarrow$. Step 38 sorts the vector developed by step 37 with matrix $\Pi_i$, and step 39 performs the Γ mapping to yield the constant weight code.

Figure 4:
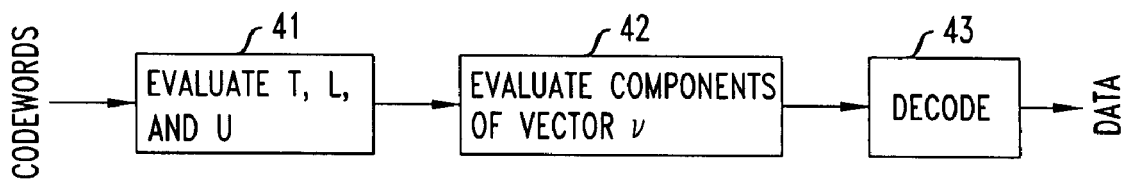
FIG. 4 shows a decoder that complements the FIG. 2 encoder.

FIG. 4 shows the apparatus for decoding a signal encoded by the FIG. 2 apparatus in accord with the method depicted in FIG. 3. It includes processor 41 that evaluates matrix T, and derives matrices L and U. Thereafter, processor 42 evaluates components of vector v, and from the components of vector v processor 43 derives the original vector x, and decoded to form data bits.

Example:

For the above example of an input vector of x=(10,15,11, 5,17), the permutation matrix, $\Pi^{-1}(x)$ is $$\prod{}^{-1}(x') = \begin{bmatrix} 0 & 0 & 0 & 0 & 1 \\ 0 & 1 & 0 & 0 & 0 \\ 0 & 0 & 1 & 0 & 0 \\ 1 & 0 & 0 & 0 & 0 \\ 0 & 0 & 0 & 1 & 0 \end{bmatrix}, \quad (18)$$

which based on equation (10) yields $$v = \begin{bmatrix} 1 & -1 & 0 & 0 & 0 \\ 0 & 1 & -1 & 0 & 0 \\ 0 & 0 & 1 & -1 & 0 \\ 0 & 0 & 0 & 1 & -1 \\ 1 & 1 & 1 & 1 & 1 \end{bmatrix} \begin{bmatrix} 10 \\ 15 \\ 11 \\ 5 \\ 17 \end{bmatrix} = \begin{bmatrix} -5 \\ 4 \\ 6 \\ -12 \\ 58 \end{bmatrix}. \quad (19)$$

Computing D and $D^{-1}$ yields the transforming matrix $$T(x') = D \prod{}^{-1}(x') D^{-1} = \begin{bmatrix} 0 & -1 & -1 & -1 & 0 \\ 0 & 1 & 0 & 0 & 0 \\ -1 & -1 & 0 & 0 & 0 \\ 1 & 1 & 1 & 0 & 0 \\ 0 & 0 & 0 & 0 & 1 \end{bmatrix}, \quad (20)$$

and $$T^\#(x') = \begin{bmatrix} 0 & -1 & -1 & -1 \\ 0 & 1 & 0 & 0 \\ -1 & -1 & 0 & 0 \\ 1 & 1 & 1 & 0 \end{bmatrix}. \quad (21)$$

Selecting $$P = \begin{bmatrix} 0 & 0 & 1 & 0 \\ 0 & 1 & 0 & 0 \\ 1 & 0 & 0 & 0 \\ 0 & 0 & 0 & 1 \end{bmatrix} \quad (22)$$

yields $$PT^\#_{w-1} = L^{-1}U = \begin{bmatrix} 1 & 0 & 0 & 0 \\ 0 & 1 & 0 & 0 \\ 0 & -1 & 1 & 0 \\ -1 & 0 & -1 & 1 \end{bmatrix} \begin{bmatrix} -1 & -1 & 0 & 0 \\ 0 & 1 & 0 & 0 \\ 0 & 0 & -1 & -1 \\ 0 & 0 & 0 & -1 \end{bmatrix}, \quad (23)$$

and $$L = \begin{bmatrix} 1 & 0 & 0 & 0 \\ 0 & 1 & 0 & 0 \\ 0 & 1 & 1 & 0 \\ 0 & 1 & 1 & 1 \end{bmatrix}. \quad (24)$$

The resulting $\tilde{\delta}$ vector that is (0,4,0,8), and according to equation (16)

$$\tilde{x}_1 = \max_{i,1\le i \le w} x_i = 17, \tilde{x}_2 = 17, \tilde{x}_3 = 13, \tilde{x}_4 = 13, \text{ and } \tilde{x}_4 = 5 \quad (25)$$

or x'$_\downarrow$=(17,17,13,13,5). Multiplying by the matrix $\Delta$(w=5) defined by equation (7) yields vector z=(0,1,1,5,20). Multiplying by the inverse of the sorting matrix $\Pi^{-1}(x)$, $(\Pi^{-1}(x))^{-1}=\Pi(x)=(\Pi^{-1}(x))^T$, results in vector (5,1,1,10,0). Finally, mapping $\Gamma$ yields 00000101010000000000011.

The invention claimed is:

1. A method for encoding an applied signal to form an output signal employed in a communication environment comprising the steps of:
   receiving an input signal having values that satisfy a preselected constraint that is not invariant under permutations;
   developing a modified signal through a process that involves progressive computing of elements of the modified signal by use of the input signal, previously computed elements of the modified signal, information about said preselected constraint, and additional information, which process is reversible; and
   processing the modified signal, including performing a permutation, which processing is based on the input signal, to develop the output signal, where
   the output signal satisfies said preselected constraint, and said additional information is information about said permutation that is employed in the step of processing.

2. A method for coding a signal into a constant weight code once the code weight is selected and a code length is selected, comprising the steps of:
   pre-coding a block of bits of incoming stream of blocks, where each of the blocks contains a given number of bits, into a vector x that corresponds to a symbol in w-dimensional space that lies on, or within, a w-dimensional cube;
   sorting the elements of said vector in descending order, and developing therefrom a permutation matrix $\Pi^{-1}(x)$ which, when applied to vector x sorts vector x in descending order;
   from said vector x and from said sorting matrix developing a modified vector that is sorted in descending order;
   transforming the sorted vector to a polytopal space represented by a w-dimensional lower diagonal matrix;
   inverse sorting the transformed vector, and
   developing said constant weight code from results of the inverse sorting.

3. The method of claim 2 where elements of said vector x satisfy a modular constraint where the difference between the value of $x_i$ and $x_{i+1}$ is a multiple of w−i+1, where $x_i$ is the $i^{th}$ element of vector x, $x_{i+1}$ is the $(i+1)^{th}$ element of vector x and w is the weight of the code; and where elements of said modified vector also satisfy the modular constraint.

4. The method of claim 2 where the w-dimensional lower diagonal matrix is $$V_0 = \begin{bmatrix} 1/w & 0 & 0 & \ldots & 0 \\ 1/w & 1/(w-1) & 0 & \ldots & 0 \\ 1/w & 1/(w-1) & 1/(w-2) & \ldots & 0 \\ \vdots & \vdots & \vdots & \ddots & \vdots \\ 1/w & 1/(w-1) & 1/(w-2) & \ldots & 1 \end{bmatrix}$$

where w is the weight of the code.

5. The method of claim 2 where the transforming is effected by use of matrix $$\Delta = \begin{bmatrix} 1/w & -1/w & 0 & 0 & \ldots & 0 \\ 1/w & 1/w(w-1) & -1/(w-1) & 0 & \ldots & 0 \\ 1/w & 1/w(w-1) & 1/(w-1)(w-2) & -1/(w-2) & \ldots & 0 \\ 1/w & 1/w(w-1) & 1/(w-1)(w-2) & 1/(w-2)(w-3) & \ldots & 0 \\ \vdots & \vdots & \vdots & \vdots & \ddots & -1/2 \\ 1/w & 1/w(w-1) & 1/(w-1)(w-2) & 1/(w-2)(w-3) & \ldots & 1/2 \end{bmatrix}$$

where w is the weight of the code.

6. The method of claim 2 where said step of developing the modified vector, $\tilde{x}'_\downarrow$, that is sorted in descending order comprises:
   developing a lower diagonal matrix and an upper diagonal matrix corresponding and an LU decomposition of a matrix that is a function of said sorting matrix;
   progressively developing values of elements of $\tilde{x}'_\downarrow$ by employing, in the calculation of each element, values of the upper diagonal matrix, values of the lower diagonal matrix, and values of the previously developed element of $\tilde{x}'_\downarrow$.

* * * * *